United States Patent
Itzhak et al.

(10) Patent No.: US 8,618,974 B2
(45) Date of Patent: Dec. 31, 2013

(54) COUNTER CIRCUITS, ANALOG TO DIGITAL CONVERTERS, IMAGE SENSORS AND DIGITAL IMAGING SYSTEMS INCLUDING THE SAME

(75) Inventors: Yair Itzhak, Hadera (IL); Uzi Hizi, Herzliya (IL); Vadim Gelfand, Ramat Gan (IL)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 559 days.

(21) Appl. No.: 12/973,357

(22) Filed: Dec. 20, 2010

(65) Prior Publication Data

US 2012/0154649 A1 Jun. 21, 2012

(51) Int. Cl.
*H03M 1/34* (2006.01)

(52) U.S. Cl.
USPC .......................... 341/164; 341/120

(58) Field of Classification Search
USPC .................. 341/164, 155, 156, 157, 120, 133; 348/222.1, 207.99
See application file for complete search history.

(56) References Cited

U.S. PATENT DOCUMENTS 8,451,342 B2 * 5/2013 Lim et al. ............... 348/222.1
2009/0060118 A1 3/2009 Koh

FOREIGN PATENT DOCUMENTS

| JP | 07-294642 A | 11/1995 |
| JP | 2004-056464 A | 2/2004 |
| KR | 10-2009-0022002 | 3/2009 |

* cited by examiner

*Primary Examiner* — Joseph Lauture
(74) *Attorney, Agent, or Firm* — Harness, Dickey & Pierce, P.L.C.

(57) ABSTRACT

In at least one example embodiment, a counter circuit includes a latch stage configured to generate a latch stage output clock based on a first rising edge of an enable signal, a state of a counter clock at a previous falling edge of the enable signal, and a state of the output clock at the previous falling edge of the enable signal such that the latch stage output clock and the counter clock have a different state if the state of the counter clock at the previous falling edge and the state of the output clock at the previous falling edge are the same and such that the latch stage output clock and the counter clock have a same state if the state of the counter clock at the previous falling edge and the state of the output clock at the previous falling edge are different.

32 Claims, 18 Drawing Sheets

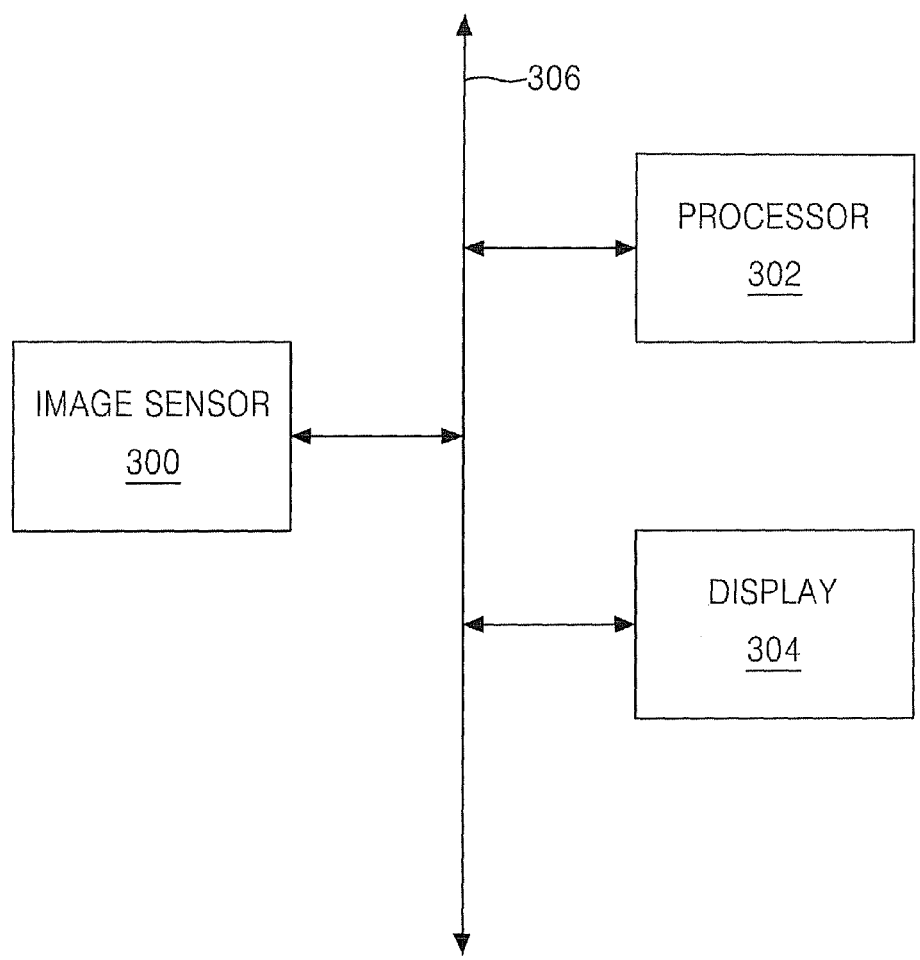

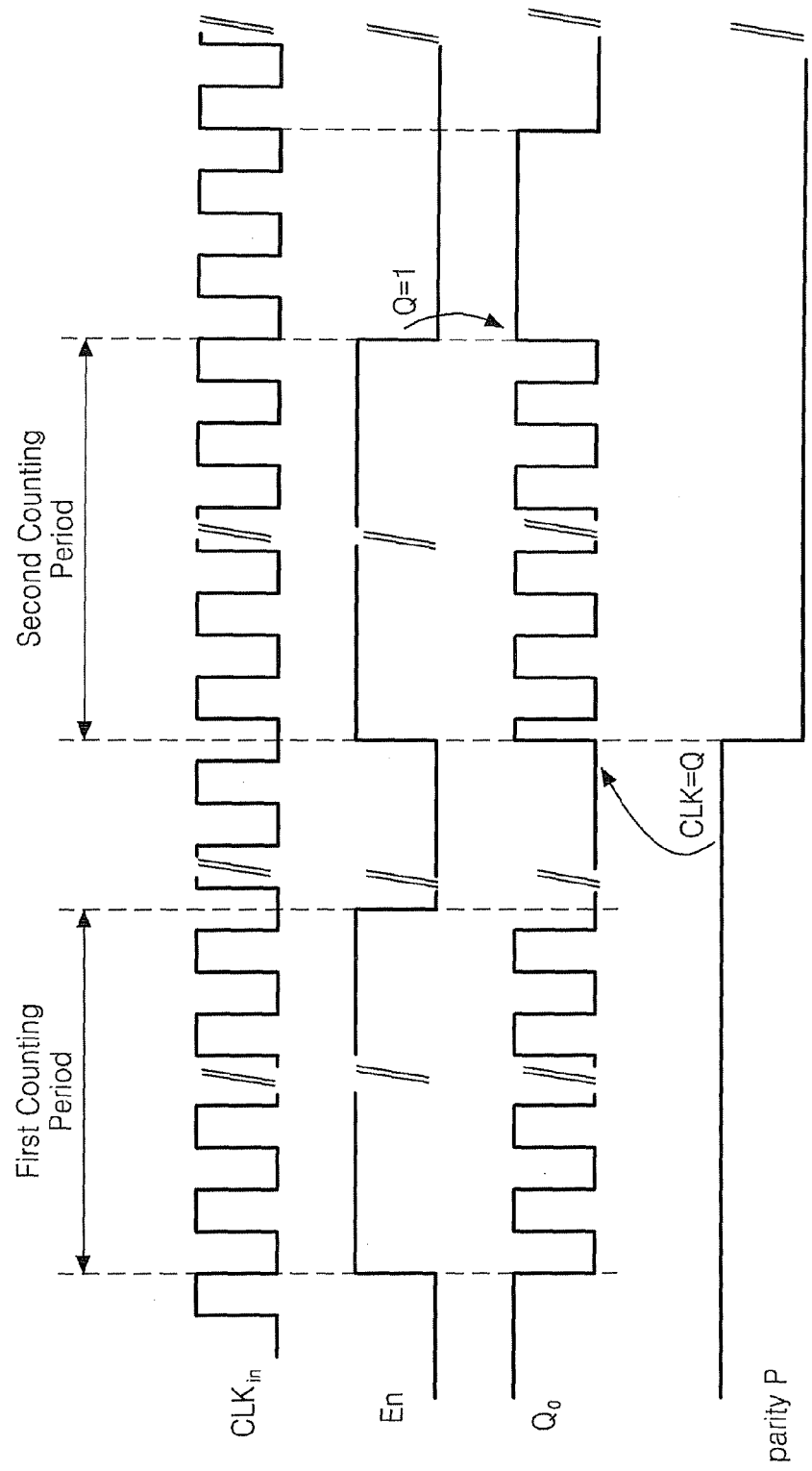

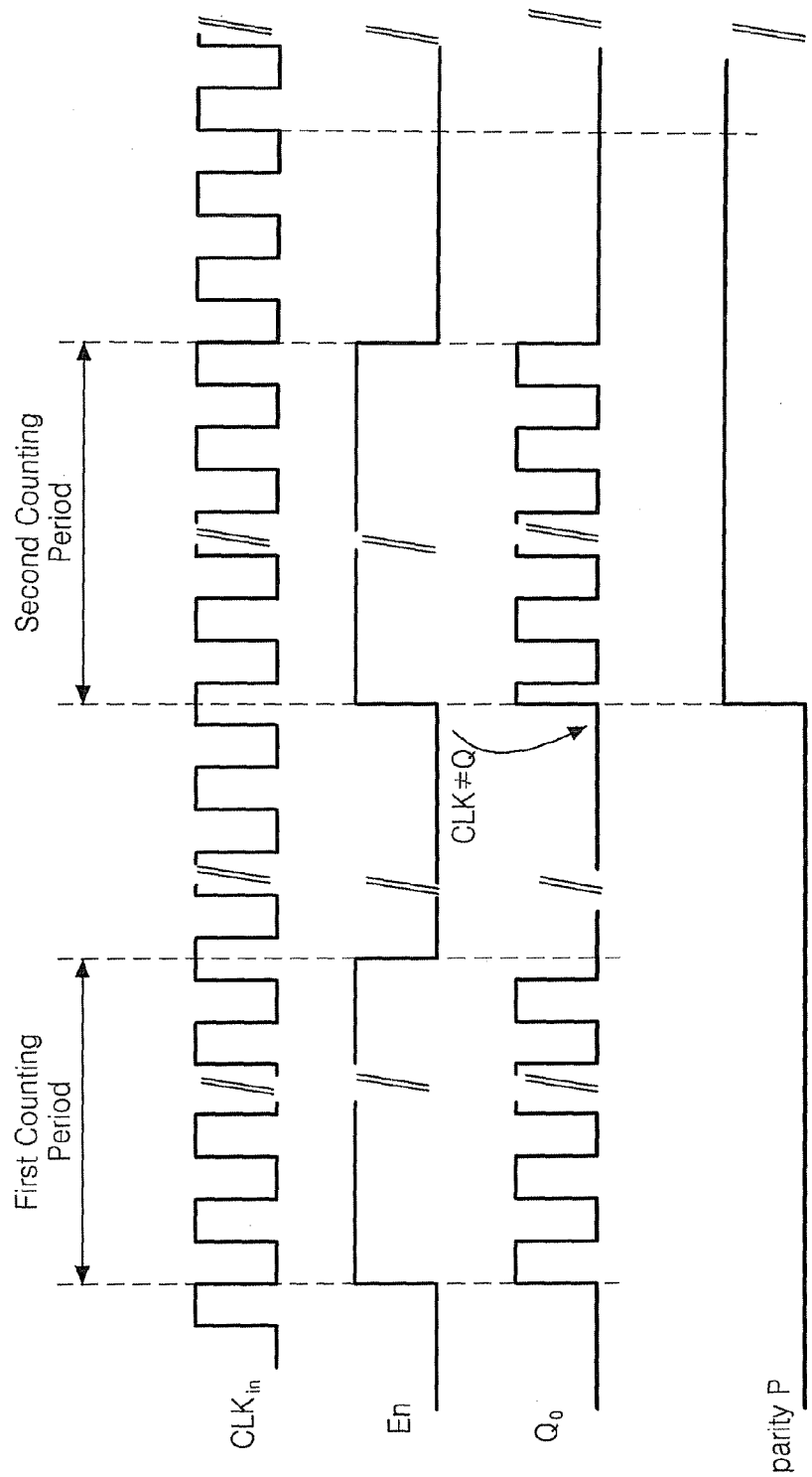

COUNTER CIRCUITS, ANALOG TO DIGITAL CONVERTERS, IMAGE SENSORS AND DIGITAL IMAGING SYSTEMS INCLUDING THE SAME

FIELD

Example embodiments relate to pixel arrays, image sensors and digital cameras including the same.

BACKGROUND

Description of the Conventional Art

An image sensor converts an optical image into an electrical signal. Types of image sensors include charge-coupled devices (CCDs) and complementary-metal-oxide-semiconductor (CMOS) image sensors. Image sensors are commonly used in digital cameras as well as other imaging devices.

Image sensors include pixels, which accumulate charge when illuminated by light. Conventionally, pixels accumulate charge in an analog circuit for a continuous period of time referred to as an exposure time. The accumulated charge is transferred to an analog-to-digital (A/D) converter (ADC), which converts the accumulated charge into a digital value for that pixel. A conventional image sensor outputs a two-dimensional (2D) array of digital values.

SUMMARY

Example embodiments disclose a DDR counter suitable for an addition operation. DDR counter circuits according to example embodiments may add a counting period.

In at least one example embodiment, a counter circuit includes a latch stage configured to generate a latch stage output clock based on a first rising edge of an enable signal, a state of a counter clock at a previous falling edge of the enable signal, and a state of the output clock at the previous falling edge of the enable signal such that the latch stage output clock and the counter clock have a different state if the state of the counter clock at the previous falling edge and the state of the output clock at the previous falling edge are the same and such that the latch stage output clock and the counter clock have a same state if the state of the counter clock at the previous falling edge and the state of the output clock at the previous falling edge are different.

Another example embodiment provides, an analog to digital converter including a comparator circuit configured to generate a comparison signal corresponding to each column of a pixel array, each comparison signal being generated based on a comparison between an input signal corresponding to a column of the pixel array and a ramp signal, a counter bank configured to convert each of the generated comparison signals into a digital output signal, the counter bank including at least one counter circuit and a line memory configured to store the digital outputs from the counter bank.

The at least one counter circuit includes a latch stage configured to generate a latch stage output clock based on a first rising edge of an enable signal, a state of a counter clock at a previous falling edge, and a state of the output clock at the previous falling edge of the enable signal such that the latch stage output clock and the counter clock have a different state if the state of the counter clock at the previous falling edge and the state of the output clock at the previous falling edge are the same and such that the latch stage output clock and the counter clock have a same state if the state of the counter clock at the previous falling edge and the state of the output clock at the previous falling edge are different.

In at least another example embodiment, an image sensor includes an active pixel array including a plurality of pixels arranged in an array, a line driver configured to select rows of pixels for output by the active pixel array, and an analog to digital converter configured to convert outputs from the active pixels into digital output code.

The analog to digital converter includes a comparator circuit configured to generate a comparison signal corresponding to each column of a pixel array, each comparison signal being generated based on a comparison between an input signal corresponding to a column of the pixel array and a ramp signal, a counter bank configured to convert each of the generated comparison signals into a digital output signal, the counter bank including at least one counter circuit and a line memory configured to store the digital outputs from the counter bank.

The at least one counter circuit includes a latch stage configured to generate a latch stage output clock based on a first rising edge of an enable signal, a state of a counter clock at a previous falling edge, and a state of the output clock at the previous falling edge of the enable signal such that the latch stage output clock and the counter clock have a different state if the state of the counter clock at the previous falling edge and the state of the output clock at the previous falling edge are the same and such that the latch stage output clock and the counter clock have a same state if the state of the counter clock at the previous falling edge and the state of the output clock at the previous falling edge are different.

Another example embodiment provides a digital imaging system including a processor configured to process captured image data, and an image sensor configured to capture image data by converting optical images into electrical signals.

The image sensor includes an active pixel array including a plurality of pixels arranged in an array, a line driver configured to select rows of pixels for output by the active pixel array, and an analog to digital converter configured to convert outputs from the active pixels into digital output code.

The analog to digital converter includes a comparator circuit configured to generate a comparison signal corresponding to each column of a pixel array, each comparison signal being generated based on a comparison between an input signal corresponding to a column of the pixel array and a ramp signal, a counter bank configured to convert each of the generated comparison signals into a digital output signal, the counter bank including at least one counter circuit and a line memory configured to store the digital outputs from the counter bank.

The at least one counter circuit includes a latch stage configured to generate a latch stage output clock based on a first rising edge of an enable signal, a state of an counter clock at a previous falling edge, and a state of the output clock at the previous falling edge of the enable signal such that the latch stage output clock and the counter clock have a different state if the state of the counter clock at the previous falling edge and the state of the output clock at the previous falling edge are the same and such that the latch stage output clock and the counter clock have a same state if the state of the counter clock at the previous falling edge and the state of the output clock at the previous falling edge are different.

BRIEF DESCRIPTION OF THE DRAWINGS

Example embodiments will become more apparent and readily appreciated from the following description of the drawings in which:

FIG. 3 is a block diagram illustrating a digital imaging system according to an example embodiment;

FIGS. 6a-6b illustrate timing diagrams for operations performed by the latch stage of FIGS. 5a-5b;

FIG. 7b illustrates a timing diagram for the up/down counter of FIG. 7a;

DETAILED DESCRIPTION

Figure 1:
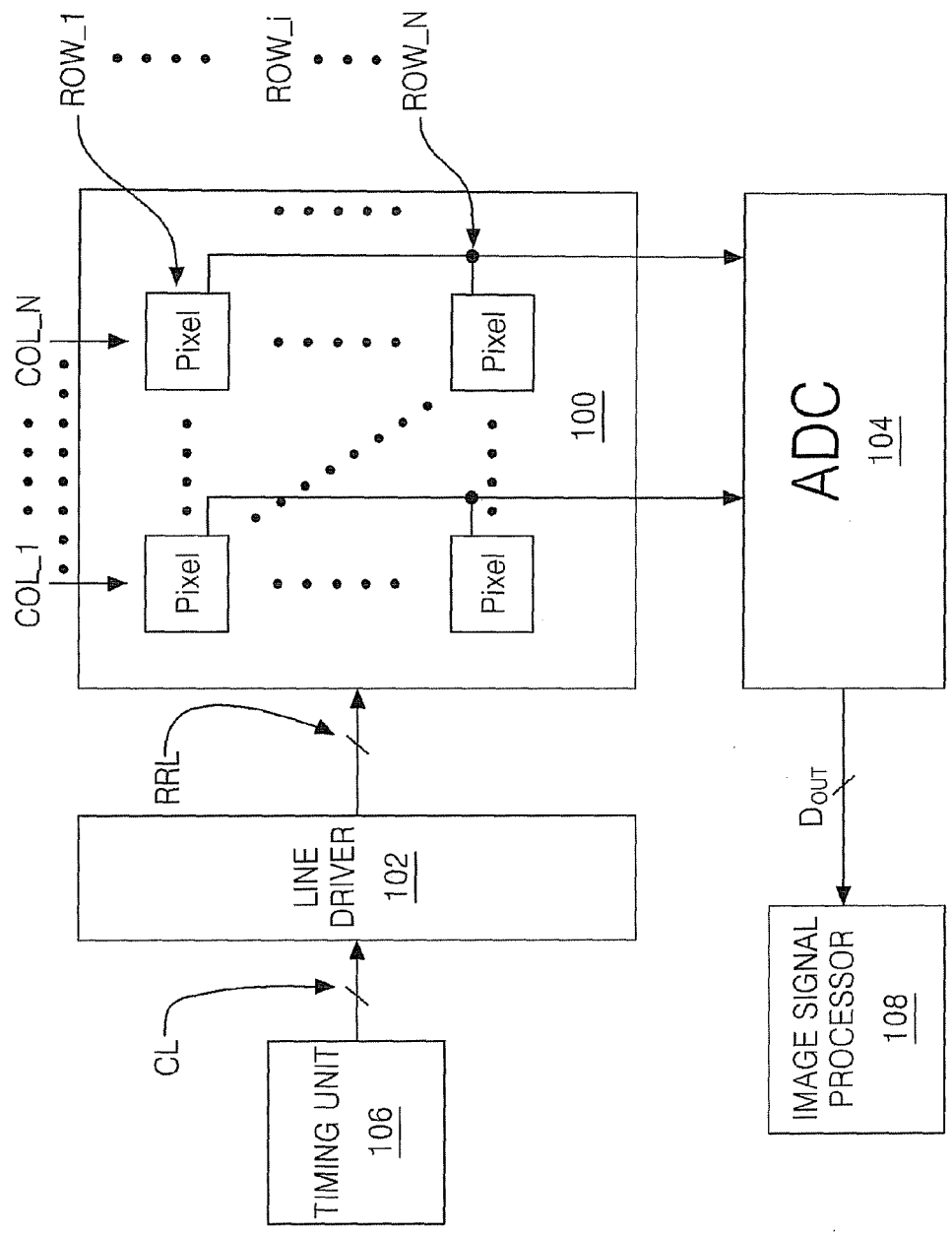
FIG. 1 illustrates an image sensor according to an example embodiment.

Example embodiments will now be described more fully with reference to the accompanying drawings. Many alternate forms may be embodied and example embodiments should not be construed as limited to example embodiments set forth herein.

It will be understood that, although the terms first, second, etc. may be used herein to describe various elements, these elements should not be limited by these terms. These tee are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Example embodiments relate to image sensors and methods of operating the same. Example embodiments will be described herein with reference to complimentary metal oxide semiconductor (CMOS) image sensors (CIS); however, those skilled in the art will appreciate that example embodiments are applicable to other types of image sensors.

Specific details are provided in the following description to provide a thorough understanding of example embodiments. However, it will be understood by one of ordinary skill in the art that example embodiments may be practiced without these specific details. For example, systems may be shown in block diagrams in order not to obscure the example embodiments in unnecessary detail. In other instances, well-known processes, structures and techniques may be shown without unnecessary detail in order to avoid obscuring example embodiments.

Also, it is noted that example embodiments may be described as a process depicted as a flowchart, a flow diagram, a data flow diagram, a structure diagram, or a block diagram. Although a flowchart may describe the operations as a sequential process, many of the operations may be performed in parallel, concurrently or simultaneously. In addition, the order of the operations may be re-arranged. A process may be terminated when its operations are completed, but may also have additional steps not included in the figure. A process may correspond to a method, a function, a procedure, a subroutine, a subprogram, etc. When a process corresponds to a function, its termination may correspond to a return of the function to the calling function or the main function.

Moreover, as disclosed herein, the term "storage medium" may represent one or more devices for storing data, including read only memory (ROM), random access memory (RAM), magnetic RAM, core memory, magnetic disk storage mediums, optical storage mediums, flash memory devices and/or other machine readable mediums for storing information. The term "computer-readable medium" may include, but is not limited to, portable or fixed storage devices, optical storage devices, wireless channels and various other mediums capable of storing, containing or carrying instruction(s) and/or data.

Furthermore, example embodiments may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a storage medium. A processor(s) may perform the necessary tasks.

A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

As will be described in more detail below, example embodiments may be implemented in conjunction with a gray code counter (GCC) and/or a per-column binary counter. As discussed herein, example embodiments may be implemented as a double data rate (DDR) counter. In another example, a per-column implementation may perform bit-wise inversion for correlated double sampling (CDS) addition and subtraction.

In example embodiments high and low logic states may be referred to as one and zero, respectively, but should not be limited thereto.

FIG. 1 illustrates an image sensor according to an example embodiment.

FIG. 1 illustrates a conventional architecture for a complementary-metal-oxide-semiconductor (CMOS) image sensor.

Referring to FIG. 1, a timing unit or circuit 106 controls a line driver 102 through one or more control lines CL. In one example, the timing unit 106 causes the line driver 102 to generate a plurality of read and reset pulses. The line driver 102 outputs the plurality of read and reset pulses to a pixel array 100 on a plurality of read and reset lines RRL.

The pixel array 100 includes a plurality of pixels P arranged in an array of rows ROW_1-ROW_N and columns COL_1-COL_N. Each of the plurality of read and reset lines RRL corresponds to a row of pixels P in the pixel array 100. In FIG. 1, each pixel P may be an active-pixel sensor (APS), and the pixel array 100 may be an APS array.

In more detail with reference to example operation of the image sensor in FIG. 1, read and reset pulses for an ith row ROW_i (where i={1, ..., N}) of the pixel array 100 are output from the line driver 102 to the pixel array 100 via an ith of the read and reset lines RRL. In one example, the line driver 102 applies a reset signal to the ith row ROW_i of the pixel array 100 to begin an exposure period. After a given, desired or predetermined exposure time, the line driver 102 applies a read signal to the same ith row ROW_i of the pixel array to end the exposure period. The application of the read signal also initiates reading out of pixel information (e.g., exposure data) from the pixels P in the ith row ROW_i.

The analog to digital converter (ADC) 104 converts the output voltages from the ith row of readout pixels into a digital signal (or digital data). The ADC 104 may perform this conversion either serially or in parallel. An ADC 104 having a column parallel-architecture converts the output voltages into a digital signal in parallel. The ADC 104 then outputs the digital data (or digital code) DOUT to a next stage processor such as an image signal processor (ISP) 108, which processes the digital data to generate an image. In one example, the ISP 108 may also perfoi m image processing operations on the digital data including, for example, gamma correction, auto white balancing, application of a color correction matrix (CCM), and handling chromatic aberrations.

Figure 2A:
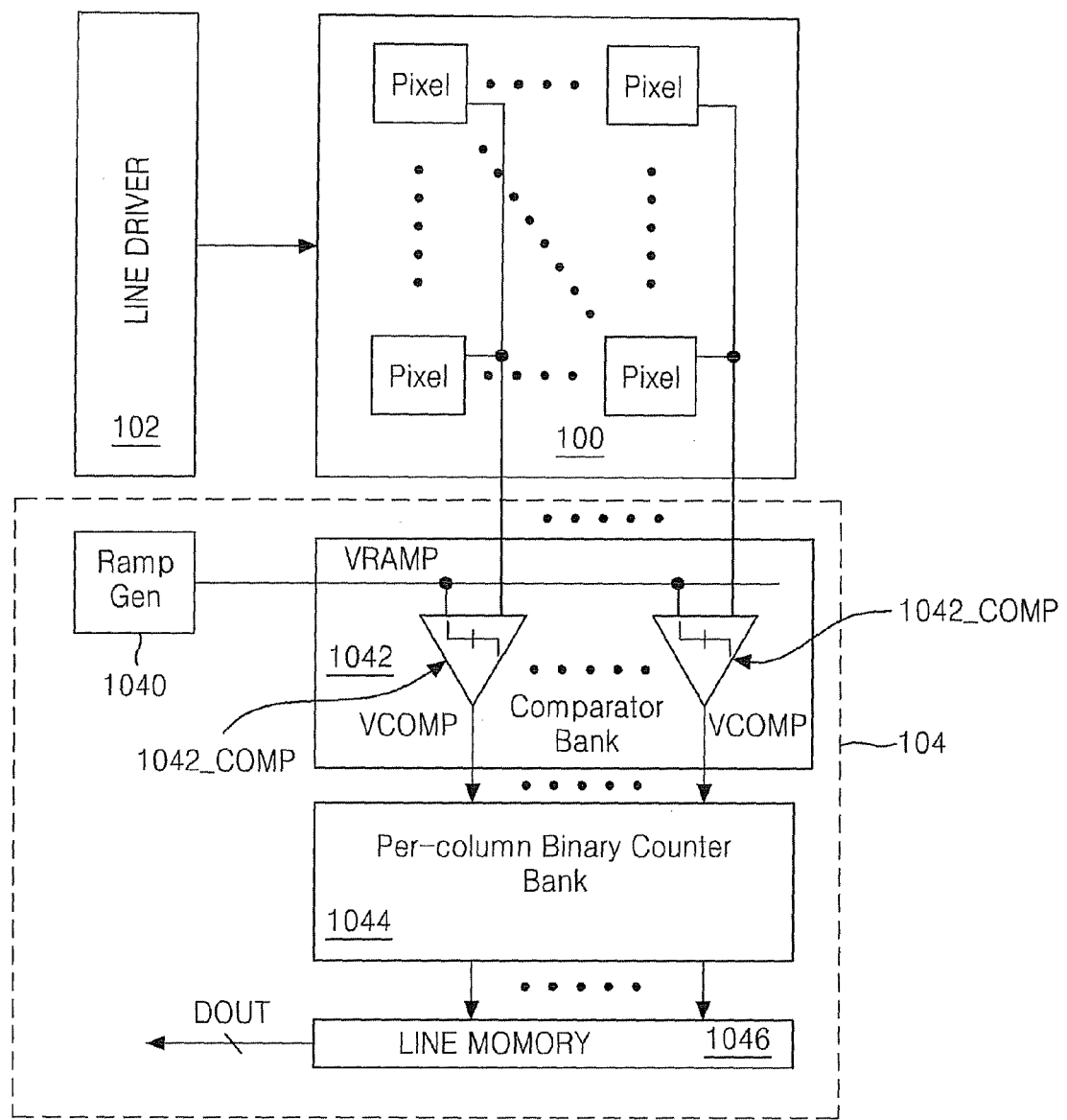
FIGS. 2A and 2B are more detailed illustrations of image sensors according to other example embodiments.
Figure 2B:
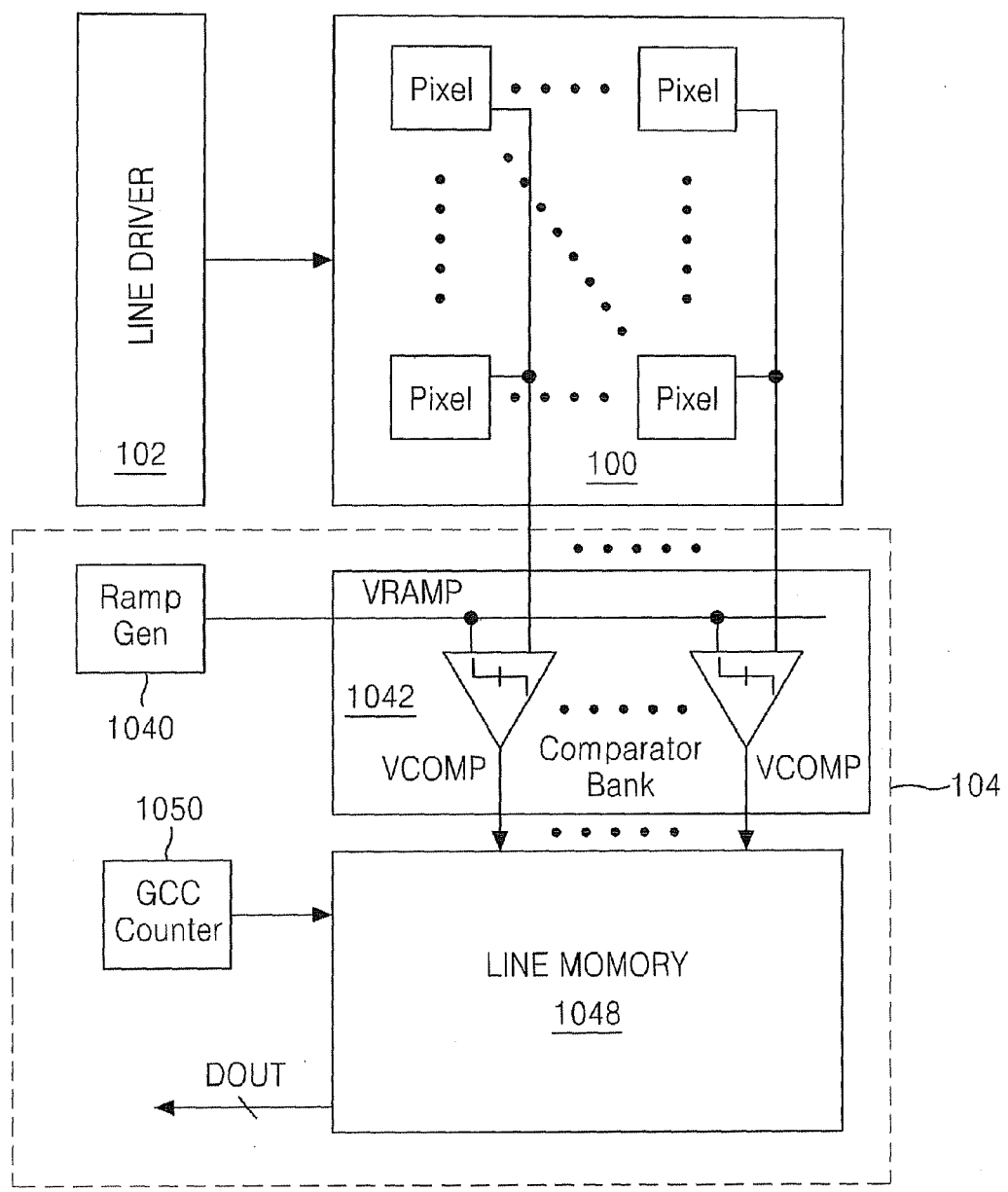

FIGS. 2A and 2B show example ADCs in more detail.

Referring to FIG. 2A, a ramp generator 1040 generates a reference voltage (or ramp signal) VRAMP and outputs the generated reference voltage VRAMP to the comparator bank 1042. The comparator bank 1042 compares the ramp signal VRAMP with each output from the pixel array 100 to generate a plurality of comparison signals VCOMP.

In more detail, the comparator bank 1042 includes a plurality of comparators 1042_COMP. Each of the plurality of comparators 1042_COMP corresponds to a column of pixels P in the pixel array 100. In example operation, each comparator 1042_COMP generates a comparison signal VCOMP by comparing the output of a corresponding pixel P to the ramp voltage VRAMP. The toggling time of the output of each comparator 1042_COMP is correlated to the pixel output voltage.

The comparator bank 1042 outputs the comparison signals VCOMP to a counter bank 1044, which converts the comparison signals VCOMP into digital output signals.

In more detail, the counter bank 1044 includes a counter for each column of the pixel array 100, and each counter converts a corresponding comparison signal VCOMP into a digital output signal. A counter of the counter bank 1044 according to example embodiments will be discussed in more detail later. The counter bank 1044 outputs the digital output signals to a line memory 1046. The digital output signals for an ith row ROW_i of the pixel array is referred to as digital data.

The line memory 1046 stores the digital data from the counter bank 1044 while output voltages for a new row of pixels are converted into digital output signals.

Referring to FIG. 2B, in this example the comparator 1042 outputs the comparison signals VCOMP to the line memory 1048 as opposed to the binary counter bank 1044 shown in FIG. 2A. Otherwise, the ramp generator 1040 and the comparator bank 1042 are the same as described above with regard to FIG. 2A.

A gray code counter (GCC) 1050 is coupled to the line memory 1048. In this example, the GCC 1050 generates a sequentially changing gray code.

The line memory 1048 stores the sequentially changing gray code from the GCC 1050 at a certain time point based on the comparison signals VCOMP received from the comparator bank 1042. The stored gray code represents the intensity of light received at the pixel or pixels.

FIG. 3 is a block diagram illustrating a digital imaging system according to an example embodiment.

Referring to FIG. 3, a processor 302, an image sensor 300, and a display 304 communicate with each other via a bus 306. The processor 302 is configured to execute a program and control the digital imaging system. The image sensor 300 is configured to capture image data by converting optical images into electrical signals. The image sensor 300 may be an image sensor as described above with regard to FIG. 1, 2A or 2B. The processor 302 may include the image signal processor 108 shown in FIG. 1, and may be configured to process the captured image data for storage in a memory (not shown) and/or display by the display unit 304. The digital imaging system may be connected to an external device (e.g., a personal computer or a network) through an input/output device (not shown) and may exchange data with the external device.

For example, the digital imaging system shown in FIG. 3 may embody various electronic control systems including an image sensor (e.g., a digital camera), and may be used in, for example, mobile phones, personal digital assistants (PDAs), laptop computers, netbooks, tablet computers, MP3 players, navigation devices, household appliances, or any other device utilizing an image sensor or similar device.

Referring back to FIGS. 2A and 2B, in either architecture the counter 1044/1050 begins running when the ramp signal VRAMP starts falling. When the output VCOMP of a comparator 1042_COMP toggles, the ramp code for the corresponding pixel is (VSTART-VIN), where VSTART is the start voltage of the ramp signal VRAMP and VIN is the voltage input to the comparator 1042_COMP from the pixel array 100. The resultant digital output code DOUT is stored in the line buffer (for each column separately) and read out by an image signal processor.

Figure 4A:
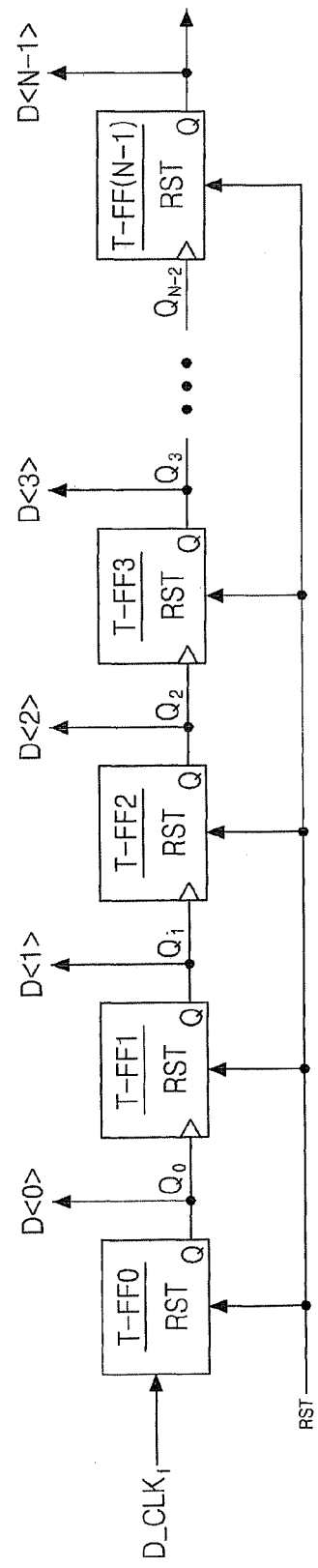
FIGS. 4a-4b illustrate ripple counters.

FIG. 4a illustrates a conventional ripple counter circuit, which may be included in the counter 1044 and 1050 shown in FIGS. 2A and 2B.

As shown in FIG. 4a, the counter circuit includes a plurality of T-flip-flops T-FF0, T-FF1, T-FF2, T-FF3, ..., T-FF(N−1) connected in series with one another. In the counter circuit shown in FIG. 4a, the power $P_0$ consumed by the first flip-flop T-FF0 is given by Equation (1) shown below.

$$P_0 = f \times V_{dd}^2 \times C_{TFF} \qquad (1)$$

In Equation (1), f is the frequency of the input clock D_CLK$_f$, V$_{dd}$ is the supply voltage to the first flip-flop T-FF0 and C$_{TFF}$ is the effective capacitance of the first flip-flop T-FF0.

Because each of flip-flops T-FF1, T-FF2, T-FF3, ..., T-FFN−1 switches at half the frequency of the preceding flip-flop, the total power consumption P$_{tot}$ for the counter circuit shown in FIG. 4 is given by Equation (2) assuming all counters are identical.

$$P_{tot} = \sum_{i=1}^{N} P_i = V_{dd}^2 C_{TFF} \sum_{i=1}^{N} \frac{f}{2^i} = 2fV_{dd}^2 C_{TFF}\left(1 - \frac{1}{2^{N+2}}\right) \leq 2P_0 \quad (2)$$

Double data rate (DDR) ripple counters are useful for reducing the power consumption of the counters, as well as power consumed in clock routing.

Figure 4B:
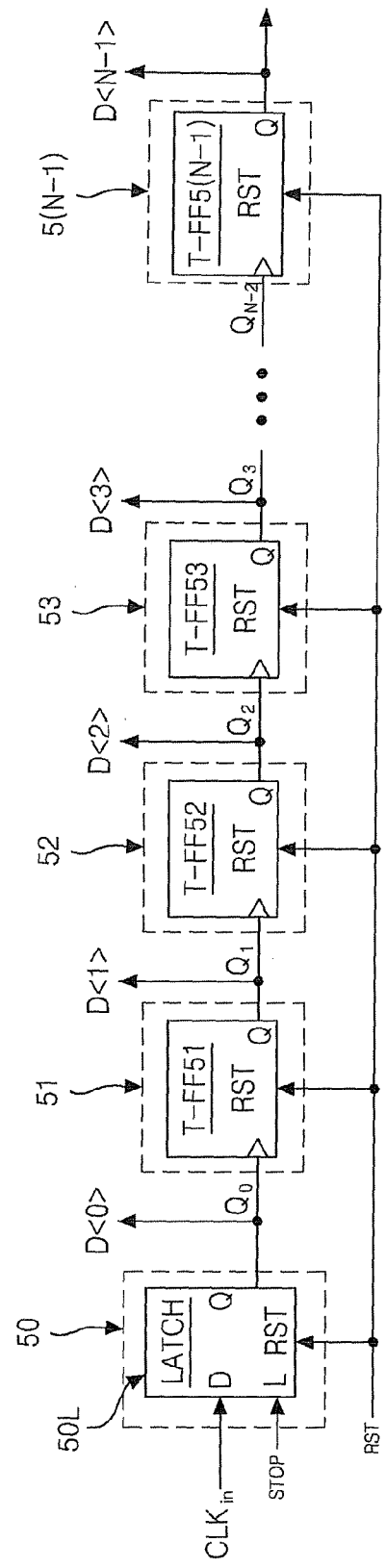

FIG. 4b shows a DDR ripple counter. A reduction in power consumption is achieved by removing the first flip-flop from a conventional ripple counter and reducing the input block frequency by half. The input clock itself is used as the least significant bit (LSB) of the counter Q$_0$.

The power consumption may be further reduced by lowering the frequency of clock generator (PLL) (not shown) and/or lowering power consumption on the wire connecting the PLL to the counter circuit.

FIG. 4b illustrates an example embodiment of a double data rate (DDR) counter circuit in which the initial stage 50 is a latch stage, rather than a counter stage. The counter circuit shown in FIG. 4b, along with the other example embodiments discussed herein may be implemented as a counter circuit in the per-column binary counter 1044 and/or the GCC 1050 shown in FIGS. 2A and 2B.

Referring to FIG. 4b, the counter circuit includes a plurality of (e.g., N) stages 50, 51, 52, 53, ..., 5(N−1) connected in series. The initial or latch stage 50 includes a latch circuit 50L, whereas each of the plurality of subsequent stages 51, 52, 53, ..., 5(N−1) include a respective one of a plurality of counter cells T-FF51, T-FF52, T-FF53, T-FF5(N−1). In this example, each of the counter cells T-FF51, T-FF52, T-FF53, T-FF5(N−1) is a T-flip-flop. Because T-flip-flops and T-flip-flop circuits are generally known, a detailed discussion is omitted.

In the counter circuit shown in FIG. 4b, the latch circuit 50L is configured to generate, between a reset counting phase and a signal counting phase of an image sensor, a latch stage output clock Q$_0$ (initial stage output) based on a state of an input clock CLK$_{in}$ such that the latch stage output clock Q$_0$ and the input clock CLK$_{in}$ have a same state at the start of the reset counting phase and a same or different state at the start of the signal counting phase depending on the state of the latch stage output clock Q$_0$ at the end of the reset counting phase.

In example operation, the latch circuit 50L outputs the latch stage output clock Q$_0$ while enabled, but stores the state of the input clock CLK$_{in}$ in response to the falling edge of enable signal En (e.g., when the latch circuit 50L stops running or is disabled). While enabled, the latch stage output clock Q$_0$ transitions (e.g., from high 'H' to low 'H' or from low to high) in response to a transition or change in state of the input clock CLK$_{in}$. The latch circuit 50L outputs the latch stage output clock Q$_0$ to the first counter cell T-FF51 of the first counter stage 51.

The first counter stage 51 generates a first counter stage output clock Q$_1$ based on the latch stage output clock Q$_0$. In so doing, the first counter cell T-FF51 toggles the state (e.g., from low to high or high to low) of the first counter stage output clock Q$_1$ based on a change in the state of the latch stage output clock Q$_0$. For example, the first counter cell T-FF51 toggles the state of the first counter stage output clock Q$_1$ as the latch stage output clock Q$_0$ rises (e.g., in response to a transition from low to high). The first counter cell T-FF51 outputs the first counter stage output clock Q$_1$ to the second counter cell T-FF52 of the second counter stage 52.

The second stage 52 generates a second counter stage output clock Q$_2$ based on the first counter stage output clock Q$_1$. In so doing, the second counter cell T-FF52 toggles the state (e.g., from low to high or high to low) of the second counter stage output clock Q$_2$ based on a change in the state of the first counter stage output clock Q$_1$. For example, the second counter cell T-FF52 toggles the state of the second counter stage output clock Q$_2$ as the first counter stage output clock Q$_1$ rises (e.g., in response to a transition from low to high). The second stage 52 outputs the second counter stage output clock Q$_1$ to the third counter cell T-FF53 of the third counter stage 53.

Each subsequent counter stage 53-5(N−1) generates a corresponding counter stage output clock Q$_3$, Q$_{N-1}$ based on a counter stage output clock from a preceding counter stage in the same or substantially the same manner as described above to generate a resultant digital output code DOUT (including D<0>, D<1>, D<2>, D<3>, D<N−1>, where D<0> is the LSB), which is stored in a line buffer (for each column separately), and read out by an image signal processor.

As mentioned above and as can be appreciated by comparing FIGS. 4a and 4b, the DDR counter circuit shown in FIG. 4b differs from conventional counter circuits at least in that the first stage includes a latch circuit, and the frequency of the input clock is reduced by about half. By replacing the initial counter stage with a latch stage, power consumption may be reduced by about 50%.

For various applications including, for example, the counter array in the column-parallel image sensor architecture, it is desirable to apply counting for two different periods and add the two results.

Figure 4C:
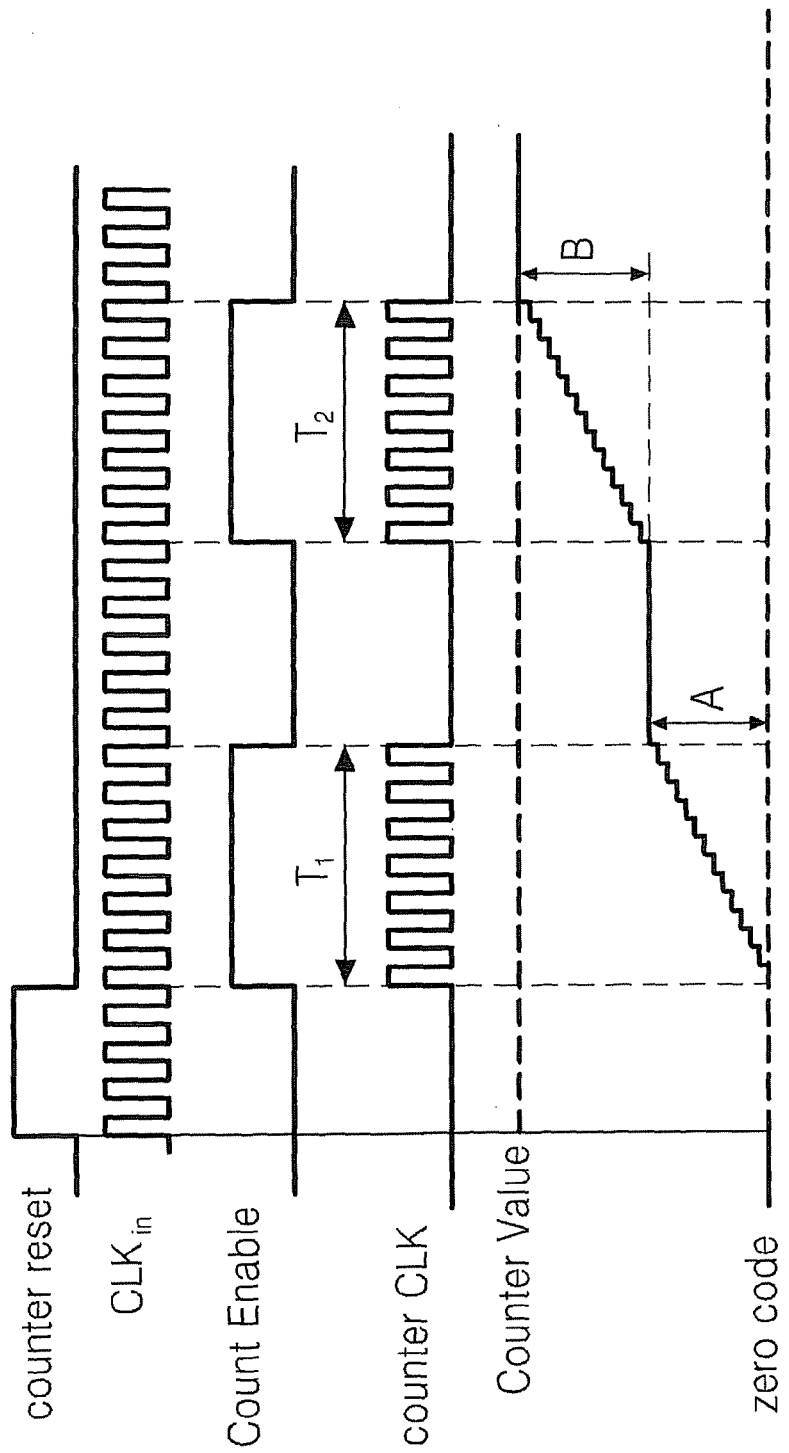
FIGS. 4c-4d illustrate timing diagrams for operations performed by the ripple counter of FIG. 4b.

FIG. 4c illustrates an example timing diagram of an addition operation performed by the DDR counter circuit of FIG. 4b.

During a first period of time T$_1$, the counter counts up to A (A proportional to T$_1$). Later, the clock counts up for a period T$_2$, adding B (proportional to T$_2$) to A. The final result is A+B.

Applying the addition operation in the DDR counter is a challenge because the LSB Q$_0$ of the counter is the same as the input clock CLK$_{in}$, which continues to toggle even during counter idle times.

If two or more different periods are counted and added together, the enable signal En is up for the time of each count.

However, the enable En may be asynchronous with the input clock CLK$_{in}$.

Figure 4D:
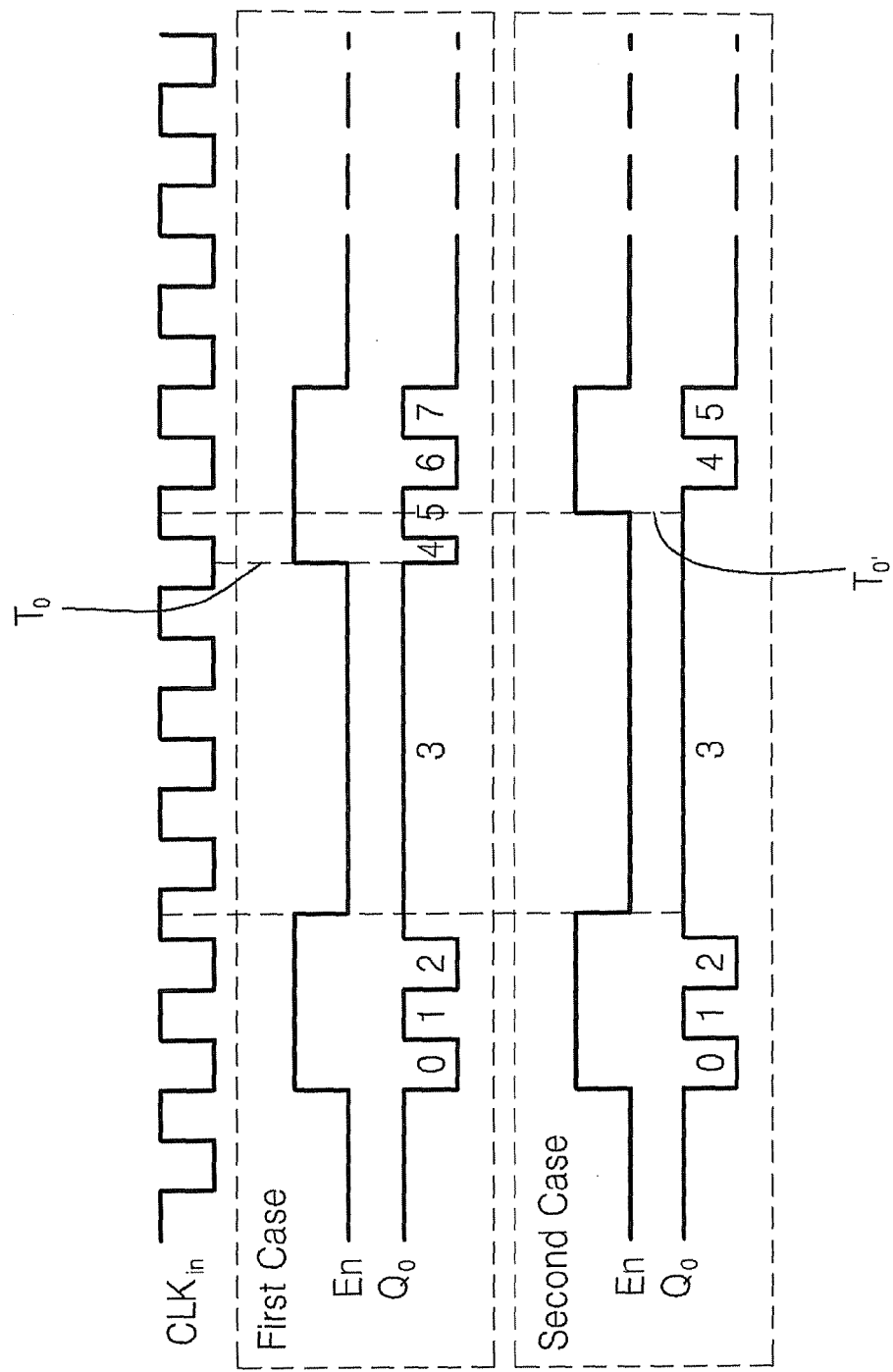

FIG. 4d illustrates first and second cases. In the first case, the enable signal EN rises at T$_0$, when the latch stage output clock Q$_0$ is not equal to the input clock CLK$_{in}$ (the phase of the latch stage output clock Q$_0$ is opposite to the phase of the input clock CLK$_{in}$). In the second case the enable signal EN rises at T$_1$ when the latch stage output clock Q$_0$ is equal to the input clock CLK$_{in}$ (the input clock CLK$_{in}$ and the latch stage output clock Q$_0$ have the same phase).

Due to the latch stage output clock Q$_0$ following the input clock CLK$_{in}$, the latch stage output clock Q$_0$ can be frozen in either high or low states. Thus, there is a problem with the addition operation when the latch stage output clock Q$_0$ consistently follows the input clock CLK$_{in}$ and changes only during the next falling/rising input clock $CLK_{in}$ edge. If the latch stage output clock $Q_0$ and the input clock $CLK_{in}$ have the same phase and the enable signal becomes a high state (i.e., second case), then the latch stage output clock $Q_0$ waits for the next input clock $CLK_{in}$ edge before changing. However, if the latch stage output clock $Q_0$ does not equal the input clock $CLK_{in}$ (i.e., the first case), then the latch stage output clock $Q_0$ changes immediately due to the latch stage output clock $Q_0$ following the input clock $CLK_{in}$. Therefore, a missing count occurs as indicated by the number 4.

Example embodiments provide double data rate (DDR) counter circuits in which the first counter stage is a latch circuit which stores the clock state when the counter stops running (i.e., the enable signal En falling). Therefore, a problem with missing a count may be reduced.

Figure 5A:
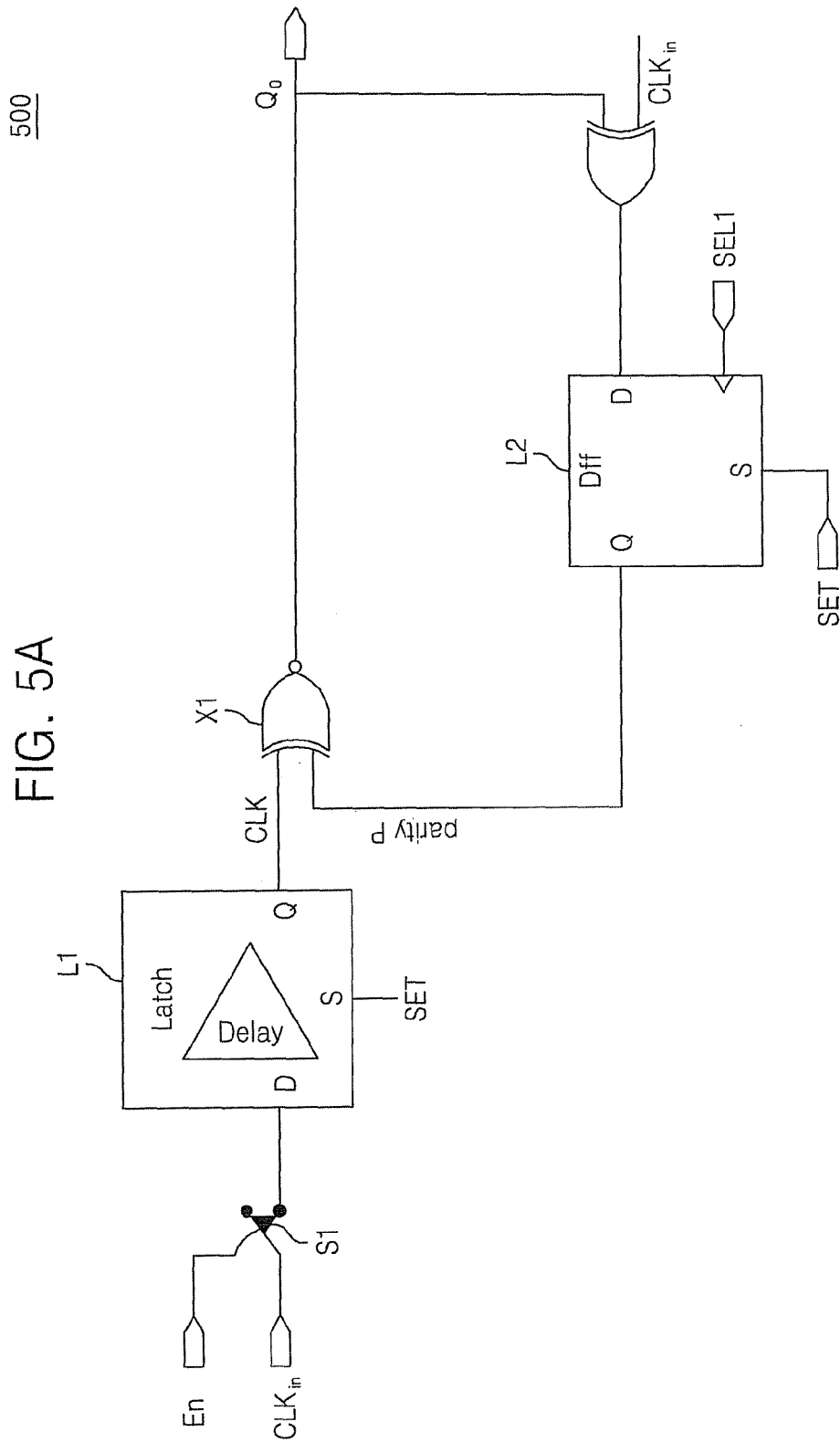
FIGS. 5a-5b illustrate a latch stage for a counter circuit according to an example embodiment.
Figure 5B:
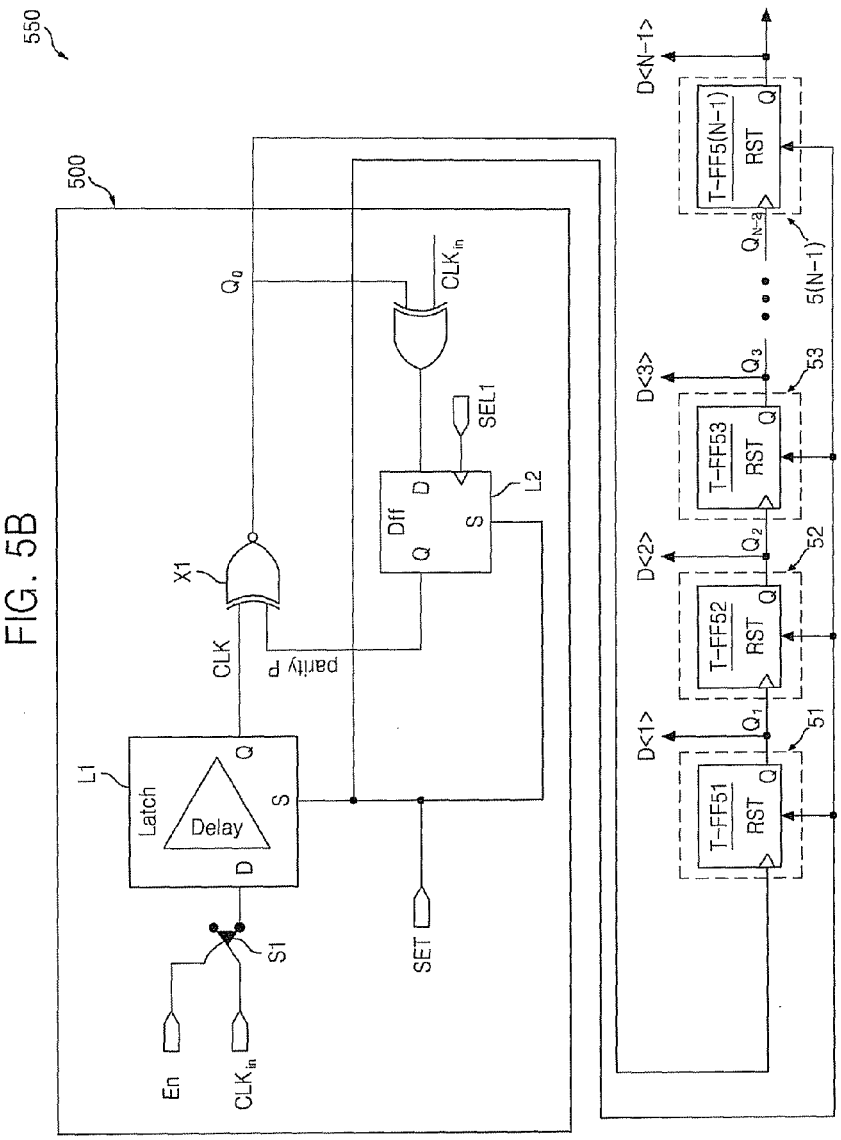

FIG. 5a illustrates an example embodiment of an initial stage of a DDR circuit. FIG. 5b shows an initial stage (latch stage) 500 of FIG. 5a in a DDR counter circuit. As shown in FIG. 5b, a DDR counter circuit 550 is the same as the DDR counter circuit shown in FIG. 4b except that DDR counter circuit 550 includes the initial stage 500 instead of the initial stage 50. FIGS. 6a-6b are timing diagrams for explaining example operations of the initial stage 500 and the DDR counter circuit 550.

Referring to FIG. 5a, the initial stage 500 includes a switch S1 configured to couple the input clock $CLK_{in}$ to a first input of a first latch L1 based on the enable signal En. The input clock $CLK_{in}$ continues to toggle even during counter idle times between a falling edge and rising edge of the enable signal En.

The first latch L1 is configured to store a state of the input clock $CLK_{in}$ when the counter stops running (i.e., at a falling edge of the enable signal En). The first latch L1 is configured to receive a set signal SET. The set signal SET may also be referred to as a reset signal. An output of the first latch L1 is coupled to a first input of a first exclusive-NOR (XNOR) logic gate X1. The output of the first latch L1 is configured to output the counter clock CLK to the first XNOR logic gate X1.

The first XNOR logic gate X1 also includes a second input coupled to an output of a second latch L2. The second input of the first XNOR logic gate X1 receives a parity signal P (second latch output clock) which is output from the second latch L2. The second latch L2 may be a D flip-flop (Dff).

An output $Q_0$ of the first XNOR logic gate X1 is the latch stage output clock and is coupled to a next counter stage (e.g., counter stage 51) and a first input of a first XOR logic gate X2.

The first XOR logic gate X2 also includes a second input configured to receive the input clock $CLK_{in}$. An output of the first XOR gate X2 is coupled to a first input of the second latch L2. The output of the first XOR gate X2 is based on the input clock $CLK_{in}$ and the latch stage output clock $Q_0$ of the first XNOR logic gate X1.

The second latch L2 also includes second and third inputs configured to receive a select signal SEL1 and the set signal SET, respectively. The select signal SEL1 is based on a rising edge of the enable signal EN. Thus, when the enable signal EN rises, the select signal SEL1 changes. The second latch L2 outputs the parity signal P based on the output of the first XOR logic gate X2, the select signal SEL1 and the set signal SET.

The second latch L2 stores the value of the latch stage output clock $Q_0$, which is the LSB value at a time between counting of the addition operation (e.g., between a rising edge and falling edge of the enable signal En). During an addition operation, the enable signal En is at a high logic level during the time of the counting periods that are added together.

The initial stage shown in FIG. 5a may be added to accommodate an N-bit counter that implements the DDR input clock, as shown in FIG. 5b. Since the initial stage 500 and the stages 51-5(N−1) have been previously described, the N-bit counter 550 will not be described in greater detail.

FIGS. 6a-6b are timing diagrams for explaining example operations of the initial stage 500 and the DDR counter circuit 500.

FIG. 6a illustrates an example timing diagram of the enable signal En rising at a time when the latch stage output clock $Q_0$ equals the counter clock CLK and the parity P is one.

Referring more specifically to FIGS. 5a and 6a, when the enable signal En rises, the switch couples the input clock $CLK_{in}$ to the first latch L1. Thus, the latch stage output clock $Q_0$ follows the input clock $CLK_{in}$ and has the same phase as the input clock $CLK_{in}$. Since the latch stage output clock $Q_0$ and the input clock $CLK_{in}$ have the same phase, the second latch outputs the parity signal P as a one. When the enable signal En rises for a next count, the latch stage output clock $Q_0$ and the input clock $CLK_{in}$ have the same phase. Therefore, the second latch L2 outputs the parity signal P being zero. If the parity signal is zero when the enable sign En rises, then the first latch L1 changes the latch stage output clock $Q_0$ (e.g., from low to high).

FIG. 6b illustrates an example timing diagram of the enable signal En rising at a time when the latch stage output clock $Q_0$ does not equal the input clock CLK and the parity P is zero.

Referring to FIGS. 5a and 6b, the latch stage output clock $Q_0$ and the input clock $CLK_{in}$ have opposite phases (parity equals 0) during a first counting period. When the enable signal En falls, the first XNOR logic gate X1 stops toggling. When the enable signal En rises during a second counting period, the latch stage output clock $Q_0$ does not equal the counter clock CLK. Therefore, the second latch L2 and the first XOR logic gate X2 change the parity P to one, causing the latch stage output clock $Q_0$ to be inverted by the first XNOR logic gate X1.

Moving forward, a counter circuit normally has the ability to subtract a first counting period from a second counting period in order to apply digital correlated double sampling (CDS) in image sensors. The first counting period may be a reset reading period and the second counting period may be a signal reading period. This may be achieved by an UP/DOWN counter circuit. An example timing diagram illustrating this counting function is shown in FIG. 7b, and an example counter circuit capable of performing this UP/DOWN counting is shown in FIG. 7a.

Figure 7A:
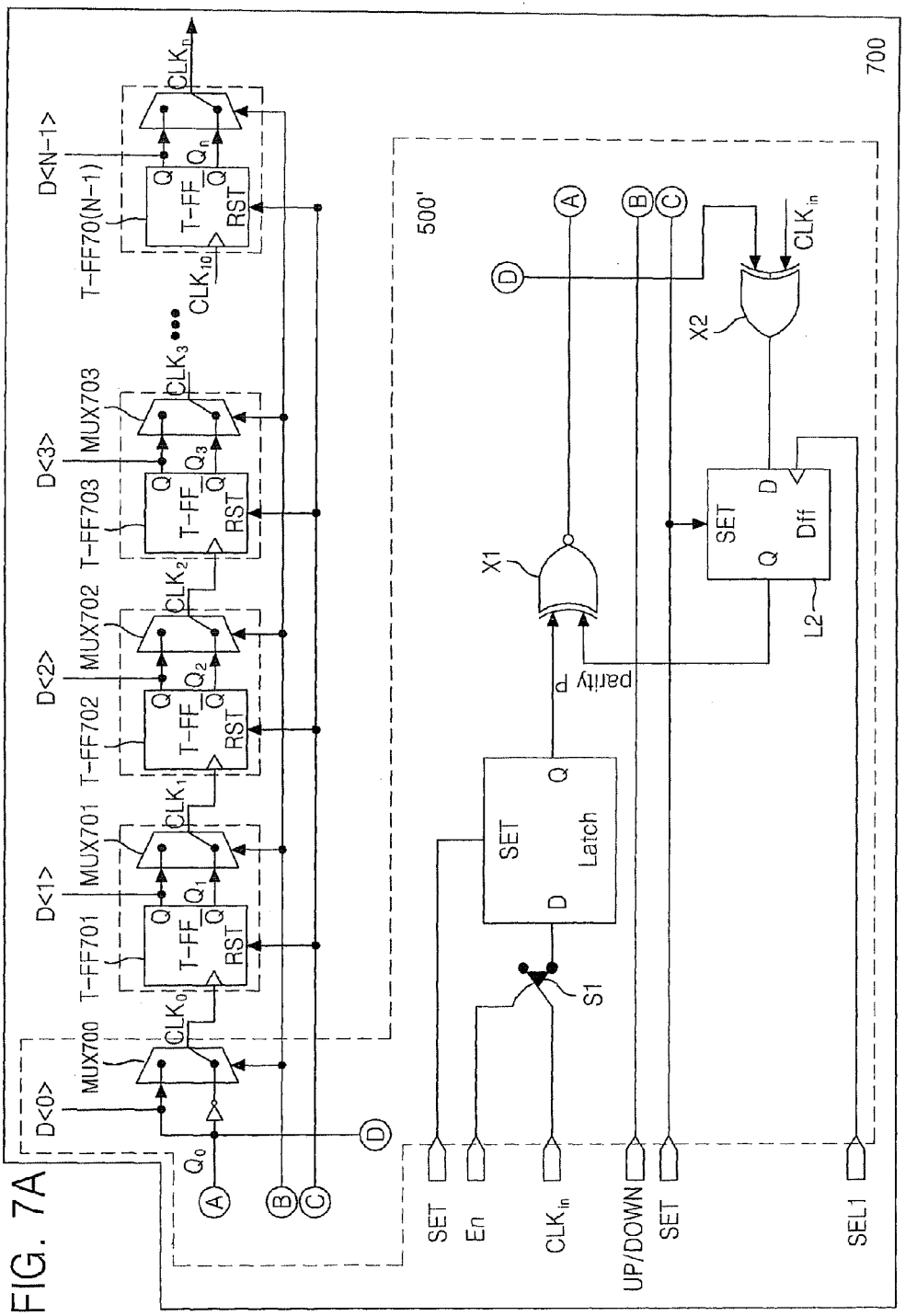
FIG. 7a illustrates an up/down counter according to example embodiments.
Figure 7B:
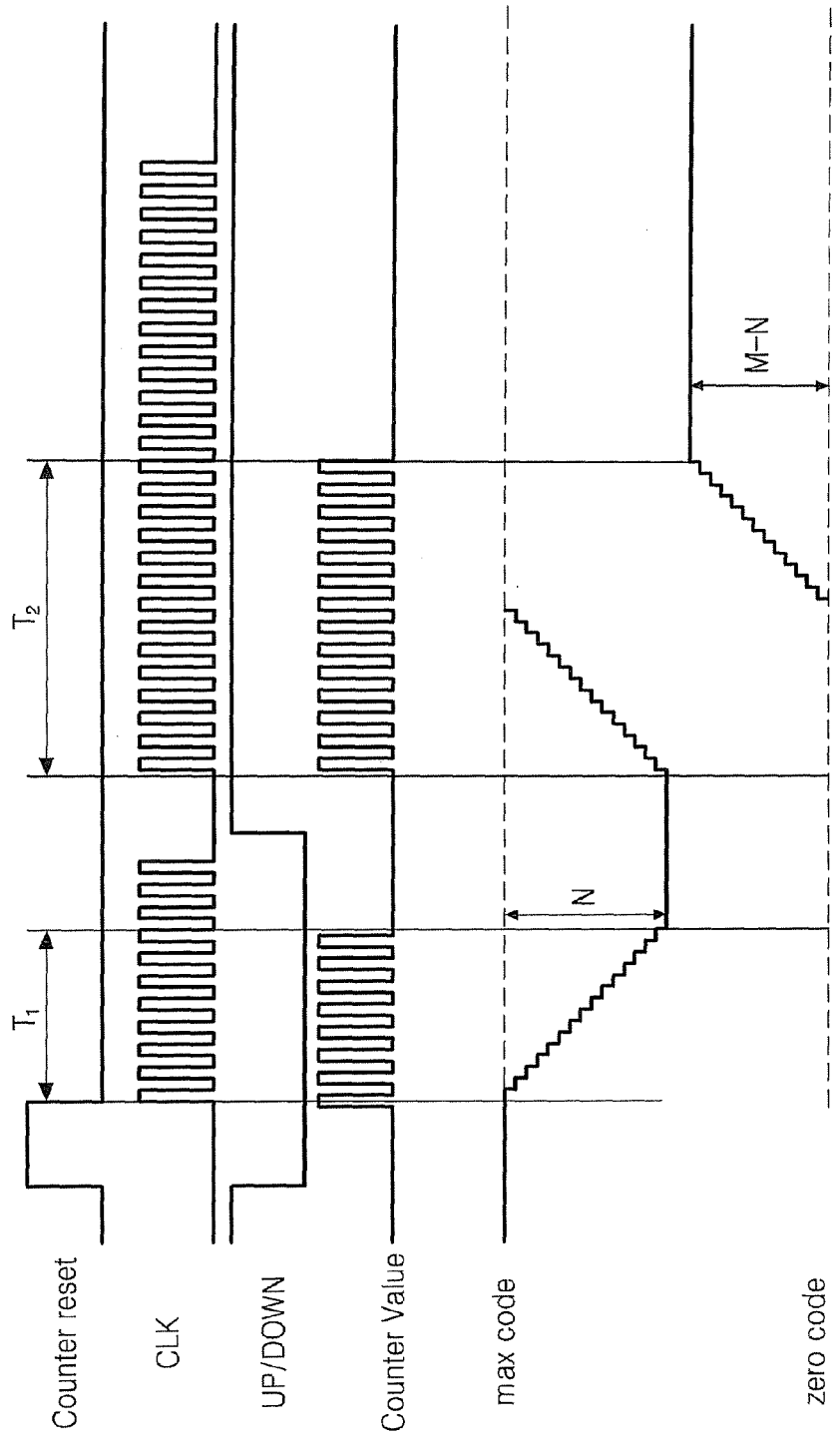

FIG. 7a illustrates an example embodiment of a counter circuit including a latch circuit similar to the latch circuit shown in FIG. 5a. The counter circuit shown in FIG. 7a is an UP/DOWN-based FF DDR counter.

As shown in FIG. 7a, a counter circuit 700 includes an initial stage 500'. The initial stage 500' is the same as the initial stage 500 except the initial stage 500' includes a multiplexer MUX700 configured to receive an output of the XNOR logic gate X1 and an inverted output of the XNOR logic gate X1.

In the example embodiment shown in FIG. 7a, the initial stage 500 operates as described above with regard to FIGS. 5a and 6a-6b, and outputs the latch stage output clock $Q_0$ to a subsequent counter stage 701.

The initial stage 500' is coupled to a plurality of subsequent counter stages 701, 702, 703, . . . , 70(N−1), each of which includes a respective counter cell (e.g., T-flip-flop) T-FF701, T-FF702, T-FF703, T-FF70(N−1) and a respective multiplexer MUX701, MUX702, MUX703, MUX70(N−1). The subsequent counter stages 701, 702, 703, . . . , 70(N−1) are connected in series with each other and with the initial stage 500'.

The first counter cell T-FF701 generates a first up counter output clock $Q_1$ and a first down counter output clock $\overline{Q_1}$ based on the latch stage output clock $Q_0$. In so doing, the first counter cell T-FF701 toggles the state (e.g., from low to high or high to low) of the first up counter output clock $Q_1$ and the first down counter output clock $\overline{Q_1}$ based on a change in the state of the latch stage output clock $Q_0$. For example, the first counter cell T-FF701 toggles the state of the first up counter output clock $Q_1$ and the first down counter output clock $\overline{Q_1}$ as the latch stage output clock $Q_0$ rises (e.g., in response to a transition from a low state to a high state). The first counter cell T-FF701 outputs the first up counter output clock $Q_1$ and the first down counter output clock $\overline{Q_1}$ to a first multiplexer MUX701.

The first multiplexer MUX701 selectively outputs one of the first up counter output clock $Q_1$ and the first down counter output clock $\overline{Q_1}$ to the second counter stage 702 as a second counter stage output clock CLK1 based on a count signal UP/DOWN to perform desired addition or subtraction. For example, to perform addition the first multiplexer MUX701 outputs the first up counter output clock $Q_1$. To perform subtraction, the first multiplexer MUX701 outputs the first down counter output clock $\overline{Q_1}$.

Each of the subsequent counter stages 702, 1603, . . . , 70(N−1) operates in a manner similar to that described above with regard to the first counter stage 701 to generate a resultant digital output code DOUT (D<0> to D<N−1>), which is stored in a line buffer (for each column separately), and read out by an image signal processor.

FIG. 7b illustrates an example timing diagram illustrating a counting function performed by the counter circuit 700 shown in FIG. 7b.

During a first counting period $T_1$, the multiplexers MUX output the down counter clock $\overline{Q_n}$, such that the counter circuit 700 counts down during the first counting period $T_1$, which is a reset counting period. In an example embodiment, the counter circuit 700 counts down for N cycles. By contrast, during a second counting period $T_2$, the multiplexers MUX of each counter stage 701 through 70(N−1) output counter clock $Q_n$ such that the counter circuit 700 counts up. The second counting period $T_2$ may be a signal counting period. In an example embodiment, the counter circuit counts up for M cycles, resulting in M-N.

Figure 8A:
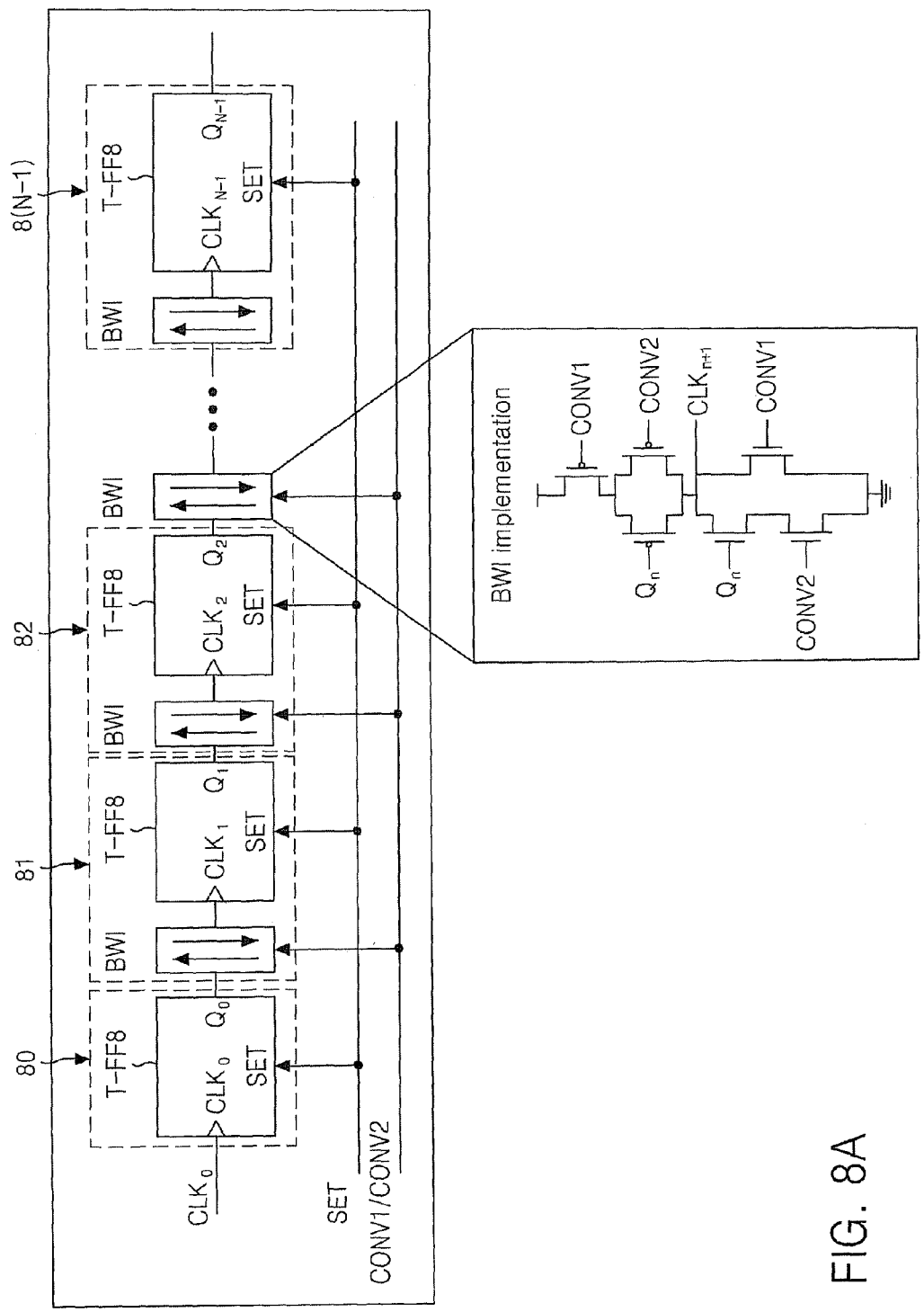
FIG. 8a illustrates an example bit-wise inversion (BWI) circuit.
Figure 8B:
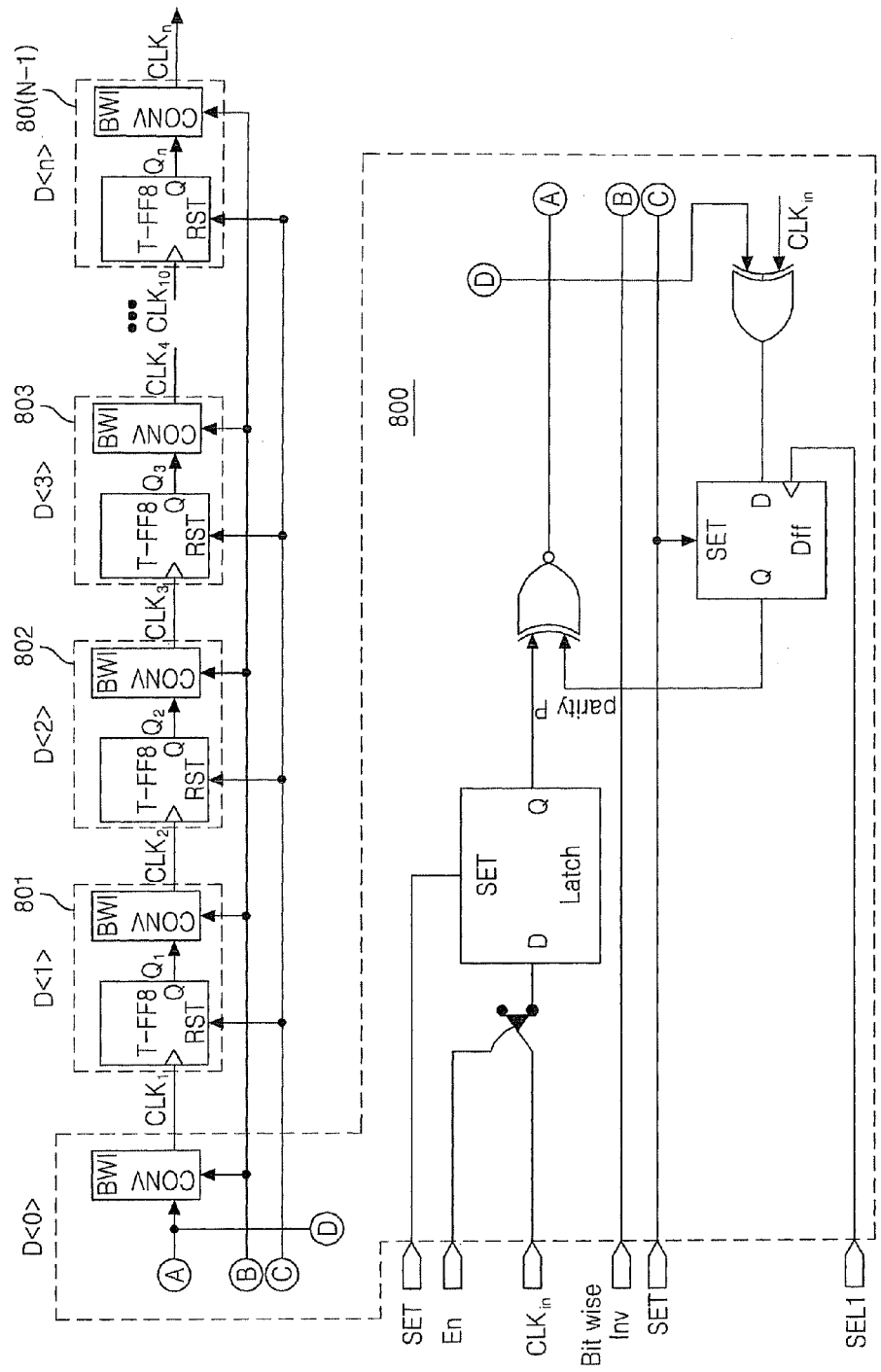
FIG. 8b illustrates a counter circuit including a BWI circuit according to an example embodiment.
Figure 8C:
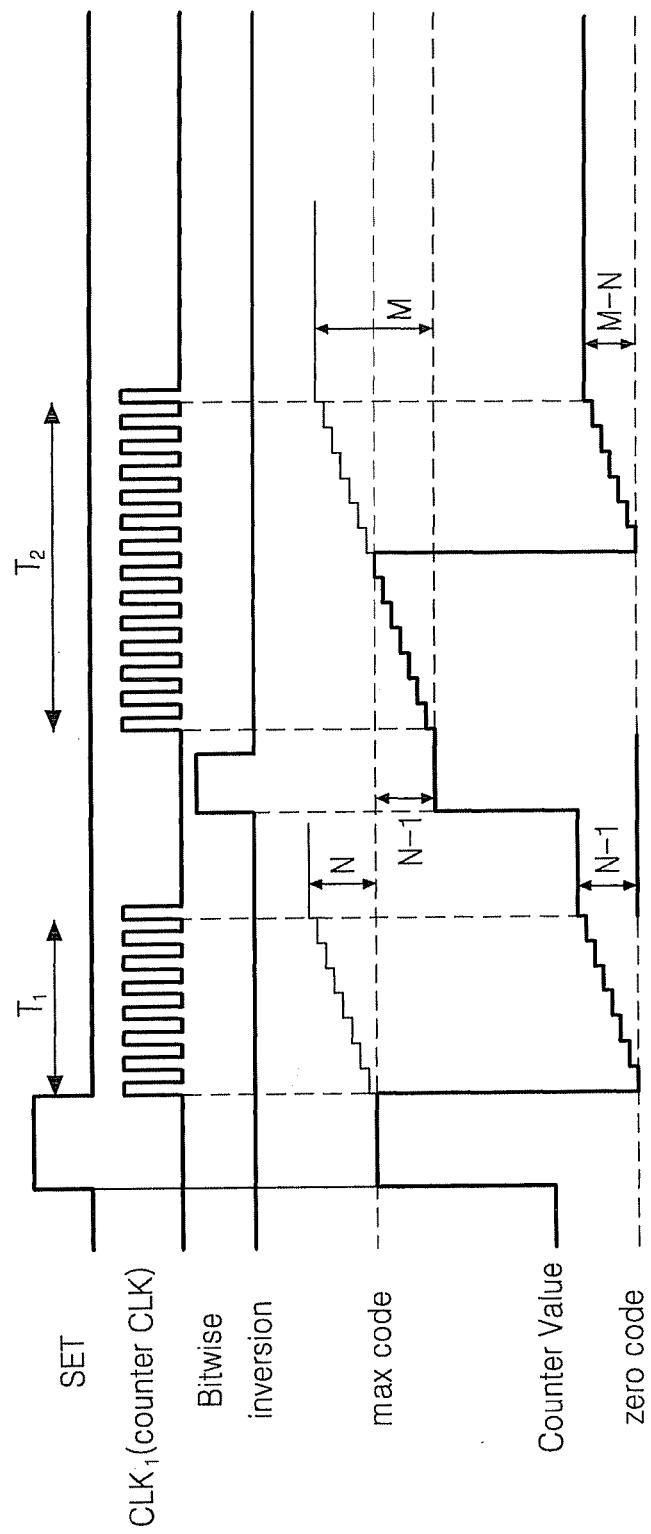
FIGS. 8c and 8d illustrate timing diagrams for operations performed by the counter circuit of FIG. 8b.

In an alternative example, bit-wise inversion (BWI) is used between the first counting period $T_1$ and the second counting period $T_2$. FIG. 8a is an example ripple counter circuit configured to support subtraction, which is required for digital CDS, by bitwise inversion. FIG. 8b is a ripple counter circuit configured to support addition and subtraction having an initial latch phase. FIG. 8c illustrates CDS subtraction by bitwise inversion using the ripple counter circuit of FIG. 8b.

Referring to FIG. 8a, the counter circuit includes a plurality of counter stages 80, 81, 82, . . . , 8(N−1) connected in series. The first counter stage 80 includes a counter cell (e.g., T flip-flop) T-FF8, whereas each of the counter stages 81, 82, . . . , 8(N−1) includes a bitwise inversion circuit BWI coupled to a counter cell T-FF8 such that each pair of adjacent counters is separated by a bit-wise inversion cell BWI.

During normal operation (e.g., the counting phase), first bitwise inversion clock CONV1 is zero, whereas second bitwise inversion clock CONV2 is one. In this case, the bitwise inversion cell BWI acts as an inverter. An example bitwise inversion operation is described below. For the sake of brevity and clarity, example bitwise inversion operation will be discussed with regard to counter stage 81. However, each counter cell may operate in the same or substantially the same manner.

Initially, first bitwise inversion clock CONV1 transitions to one, which pulls down the output of bitwise inversion cell BWI (of counter stage 81) to zero. Because the counter cell T-FF8 is assumed to be sensitive only to the rising edge of its input clock, the first bitwise inversion clock CONV1 does not cause any toggling of counter cell T-FF8.

The second bitwise inversion clock CONV2 then transitions to zero, which has no effect on the output from the bitwise inversion cell BWI.

The first bitwise inversion clock CONV1 also falls to zero. At this point, the output from the bitwise inversion cell BWI rises, which causes a transition in the output of the counter cell T-FF8. The second bitwise inversion clock CONV2 then rises, which causes the bitwise inversion cell BWI to again operate as an inverter. The output of the bitwise inversion cell BWI either remains at one or falls to zero, depending on its input. In any case, this does not cause any change in the output of the counter cell T-FF8, which is only sensitive to rising edges.

FIG. 8b is a ripple counter circuit configured to support subtraction having an initial phase 800 and a plurality of counter stages 801, 802, 803, . . . , 8(N−1) connected in series. The initial phase 800 is the same as the initial phase 500 except that the latch stage output clock $Q_0$ is input to a bitwise inversion circuit BWI. The bitwise inversion circuit BWI of the initial stage 500 is configured to output a clock signal CLK1 to the next counter stage 801. Each counter stage 801, 802, 803, . . . , 8(N−1) includes a counter cell (e.g., T flip-flop) T-FF8 and a bitwise inversion circuit BWI, both of which have been described in detail with reference to FIG. 8a. Therefore, for the sake of clarity, a detail description is omitted.

Figure 8D:
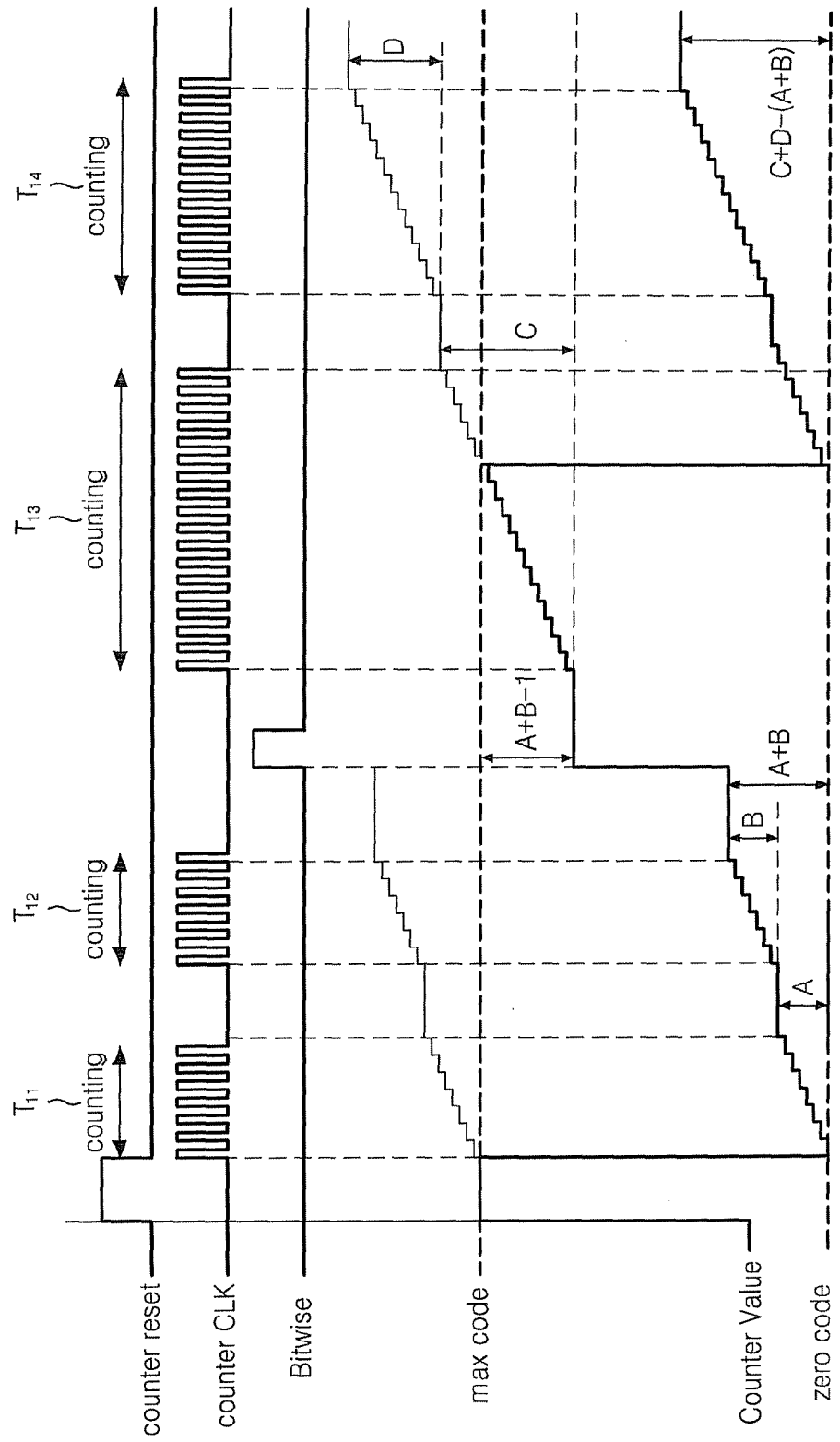

As mentioned above, FIG. 8c illustrates CDS subtraction by bitwise inversion, and FIG. 8d is a timing diagram illustrating example operation of the addition and subtraction.

Referring to FIG. 8c, initially, the counter circuit is set by a reset SET pulse.

A first counting period $T_1$ (reset counting period) is then applied by enabling the counter clock. In one example, N clock cycles (e.g., 0 to N−1) are counted. Bitwise inversion, as described above, is then applied. The output code then goes from N−1 to −N.

A second counting period $T_2$ (signal counting period) is then enabled by re-enabling the counter clock. In this case, the clock is enabled for M clock cycles, which causes the final output code to be M-N.

By using the counter circuit architecture shown in FIG. 8b, the counter circuit may be composed of standard T-flip-flops as well as BWI circuits for the one-time inversion of all bits of the counter circuit. In this example, only one rising-edge in the counter clock of each counter cell T-FF9 need be generated. The BWI circuit requires three pulses: (1) the rising edge of CONV1, which causes a falling edge in the counter stage output clock $Q_n$; (2) the falling edge of CONV2, which disconnects the counter output clock $Q_n$ from a subsequent counter stage; and (3) the falling edge of CONV1, which causes a rising edge in the counter stage output clock, thus inverting the next counter stage.

FIG. 8d illustrates an addition and subtraction operation performed by the counter circuit of FIG. 8b. The counter circuit is set by a reset SET pulse. A first counting period $T_{11}$ (reset counting period) is then applied by enabling the counter clock. In one example, clock cycles are counted. A second counting period $T_{12}$ (addition to reset counting period) is then applied by enabling the counter clock. In one example, B clock cycles are counted. Thus, a result of A+B may be obtained.

Bitwise inversion, as described above, is then applied. The output code then goes from A+B to a maximum code −(A+B−1).

A third counting period $T_{13}$ is then enabled by re-enabling the counter clock. In this case, the clock is enabled for C clock cycles. A fourth counting period $T_{14}$ is then enabled by re-enabling the counter clock. The clock is enabled for D clock cycles, which causes the final output code to be C+D−(A+B). As such, both addition and subtraction may be performed.

Example embodiments of counter circuits described herein may be implemented in conjunction with the counters 1044 and 1050 shown in FIGS. 2A and 2B.

The foregoing description of example embodiments has been provided for purposes of illustration and description. It is not intended to be exhaustive or limiting. Individual elements or features of a particular embodiment are generally not limited to that particular embodiment. Rather, where applicable, individual elements or features are interchangeable and may be used in a selected embodiment, even if not specifically shown or described. The same may also be varied in many ways. All such modifications are intended to be included within the scope of this disclosure.

What is claimed is:

1. A counter circuit comprising:
a latch stage configured to generate a latch stage output clock based on a first rising edge of an enable signal, a state of a counter clock at a previous falling edge of the enable signal, and a state of the output clock at the previous falling edge of the enable signal such that the latch stage output clock and the counter clock have a different state if the state of the counter clock at the previous falling edge and the state of the output clock at the previous falling edge are the same and such that the latch stage output clock and the counter clock have a same state if the state of the counter clock at the previous falling edge and the state of the output clock at the previous falling edge are different.

2. The counter circuit of claim 1, further comprising:
a plurality of counter stages connected in series with the latch stage, each of the plurality of counter stages being configured to toggle a state of an output clock in response to a change in state of the output clock from a preceding stage.

3. The counter circuit of claim 2, wherein each of the plurality of counter stages comprises:
a counter cell configured to toggle a state of an output clock in response to a change in state of the output from a previous counter stage; and
a bit-wise inversion circuit configured to selectively perform a bit-wise inversion operation on the output of the counter cell, and to output an inverted state of the output from the counter cell.

4. The counter circuit of claim 1, wherein the latch stage further comprises:
a latch configured to receive the enable signal and an input clock and output the counter clock based on the enable signal and the input clock signal;
a first logic gate configured to receive the counter clock and a second latch output and output the latch stage output clock based on the internal clock signal and the second latch output; and,
a second latch configured to output the second latch output based on the latch stage output clock.

5. The counter circuit of claim 4, wherein the second latch output is further based on the input clock.

6. The counter circuit of claim 4, wherein the latch stage further comprises:
a second logic gate configured to output an input to the second latch based on the latch stage output clock.

7. The counter circuit of claim 1, further comprising:
a plurality of counter stages connected in series with the latch stage, each of the plurality of counter stages being configured to output one of an up counting output clock and a down counting output clock in response to an output clock from a preceding counter stage, the up counting output and the down counting output clock having opposite states.

8. The counter circuit of claim 7, wherein each of the plurality of counter stages comprises:
a counter cell configured to output the up counting output clock and the down counting output clock in response to the output clock from a preceding counter stage; and
a multiplexer configured to selectively output one of the up counting output clock and the down counting output clock to a subsequent counter stage in response to a count signal.

9. An analog to digital converter comprising:
a comparator circuit configured to generate a comparison signal corresponding to each column of a pixel array, each comparison signal being generated based on a comparison between an input signal corresponding to a column of the pixel array and a ramp signal;
a counter bank configured to convert each of the generated comparison signals into a digital output signal, the counter bank including at least one counter circuit of claim 1; and
a line memory configured to store the digital outputs from the counter bank.

10. The analog to digital converter of claim 9, further comprising:
a plurality of counter stages connected in series with the latch stage, each of the plurality of counter stages being configured to toggle a state of an output clock in response to a change in state of the output clock from a preceding stage.

11. The analog to digital converter of claim 10, wherein each of the plurality of counter stages comprises:
a counter cell configured to toggle a state of an output clock in response to a change in state of the output from a previous counter stage; and
a bit-wise inversion circuit configured to selectively perform a bit-wise inversion operation on the output of the counter cell, and to output an inverted state of the output from the counter cell.

12. The analog to digital converter of claim 9, wherein the latch stage further comprises:
a latch configured to receive the enable signal and an input clock and output the counter clock based on the enable signal and the input clock signal;
a first logic gate configured to receive the counter clock and a second latch output and output the latch stage output clock based on the internal clock signal and the second latch output; and,
a second latch configured to output the second latch output based on the latch stage output clock.

13. The analog to digital converter of claim 12, wherein the second latch output is further based on the input clock.

14. The analog to digital converter of claim 12, wherein the latch stage further comprises:

a second logic gate configured to output an input to the second latch based on the latch stage output clock.

15. The analog to digital converter of claim 9, further comprising:
a plurality of counter stages connected in series with the latch stage, each of the plurality of counter stages being configured to output one of an up counting output clock and a down counting output clock in response to an output clock from a preceding counter stage, the up counting output and the down counting output clock having opposite states.

16. The analog to digital converter of claim 15, wherein each of the plurality of counter stages comprises:
a counter cell configured to output the up counting output clock and the down counting output clock in response to the output clock from a preceding counter stage; and
a multiplexer configured to selectively output one of the up counting output clock and the down counting output clock to a subsequent counter stage in response to a count signal.

17. An image sensor comprising:
an active pixel array including a plurality of pixels arranged in an array;
a line driver configured to select rows of pixels for output by the active pixel array; and
the analog to digital converter of claim 9 configured to convert outputs from the active pixels into digital output code.

18. The image sensor of claim 17, further comprising:
a plurality of counter stages connected in series with the latch stage, each of the plurality of counter stages being configured to toggle a state of an output clock in response to a change in state of the output clock from a preceding stage.

19. The image sensor of claim 18, wherein each of the plurality of counter stages comprises:
a counter cell configured to toggle a state of an output clock in response to a change in state of the output from a previous counter stage; and
a bit-wise inversion circuit configured to selectively perform a bit-wise inversion operation on the output of the counter cell, and to output an inverted state of the output from the counter cell.

20. The image sensor of claim 17, wherein the latch stage further comprises:
a latch configured to receive the enable signal and an input clock and output the counter clock based on the enable signal and the input clock signal;
a first logic gate configured to receive the counter clock and a second latch output and output the latch stage output clock based on the internal clock signal and the second latch output; and,
a second latch configured to output the second latch output based on the latch stage output clock.

21. The image sensor of claim 20, wherein the second latch output is further based on the input clock.

22. The image sensor of claim 20, wherein the latch stage further comprises:
a second logic gate configured to output an input to the second latch based on the latch stage output clock.

23. The image sensor of claim 17, further comprising:
a plurality of counter stages connected in series with the latch stage, each of the plurality of counter stages being configured to output one of an up counting output clock and a down counting output clock in response to an output clock from a preceding counter stage, the up counting output and the down counting output clock having opposite states.

24. The image sensor of claim 23, wherein each of the plurality of counter stages comprises:
a counter cell configured to output the up counting output clock and the down counting output clock in response to the output clock from a preceding counter stage; and
a multiplexer configured to selectively output one of the up counting output clock and the down counting output clock to a subsequent counter stage in response to a count signal.

25. A digital imaging system comprising:
a processor configured to process captured image data; and
the image sensor of claim 17 configured to capture image data by converting optical images into electrical signals.

26. The digital imaging system of claim 25, further comprising:
a plurality of counter stages connected in series with the latch stage, each of the plurality of counter stages being configured to toggle a state of an output clock in response to a change in state of the output clock from a preceding stage.

27. The digital imaging system of claim 26, wherein each of the plurality of counter stages comprises:
a counter cell configured to toggle a state of an output clock in response to a change in state of the output from a previous counter stage; and
a bit-wise inversion circuit configured to selectively perform a bit-wise inversion operation on the output of the counter cell, and to output an inverted state of the output from the counter cell.

28. The digital imaging system of claim 25, wherein the latch stage further comprises:
a latch configured to receive the enable signal and an input clock and output the counter clock based on the enable signal and the input clock signal;
a first logic gate configured to receive the counter clock and a second latch output and output the latch stage output clock based on the internal clock signal and the second latch output; and,
a second latch configured to output the second latch output based on the latch stage output clock.

29. The digital imaging system of claim 28, wherein the second latch output is further based on the input clock.

30. The digital imaging system of claim 28, wherein the latch stage further comprises:
a second logic gate configured to output an input to the second latch based on the latch stage output clock.

31. The digital imaging system of claim 25, further comprising:
a plurality of counter stages connected in series with the latch stage, each of the plurality of counter stages being configured to output one of an up counting output clock and a down counting output clock in response to an output clock from a preceding counter stage, the up counting output and the down counting output clock having opposite states.

32. The digital imaging system of claim 31, wherein each of the plurality of counter stages comprises:
a counter cell configured to output the up counting output clock and the down counting output clock in response to the output clock from a preceding counter stage; and
a multiplexer configured to selectively output one of the up counting output clock and the down counting output clock to a subsequent counter stage in response to a count signal.

* * * * *